(12) United States Patent
Kolin et al.

(10) Patent No.: US 8,171,142 B2
(45) Date of Patent: May 1, 2012

(54) DATA CENTER INVENTORY MANAGEMENT USING SMART RACKS

(75) Inventors: Benjamin Trevor Kolin, Sunnyvale, CA (US); Eric Marshall Rider, San Jose, CA (US)

(73) Assignee: VMware, Inc., Palo Alto, CA (US)

( * ) Notice: Subject to any disclaimer, the term of this patent is extended or adjusted under 35 U.S.C. 154(b) by 135 days.

(21) Appl. No.: 12/827,977

(22) Filed: Jun. 30, 2010

(65) Prior Publication Data
US 2012/0005344 A1    Jan. 5, 2012

(51) Int. Cl.
*G06F 15/173* (2006.01)
*G06F 15/00* (2006.01)

(52) U.S. Cl. ........ 709/226; 709/223; 382/104; 382/291; 382/108; 382/113; 382/140; 713/186

(58) Field of Classification Search .................. 709/226, 709/223
See application file for complete search history.

(56) References Cited

U.S. PATENT DOCUMENTS

| | | | | |
|---|---|---|---|---|
| 7,961,911 B2 * | 6/2011 | Takehara et al. | ............... | 382/104 |
| 2005/0228618 A1 * | 10/2005 | Patel et al. | .................... | 702/188 |

* cited by examiner

*Primary Examiner* — Jude Jean Gilles

(57) ABSTRACT

A system for managing physical and virtual inventory in a data center is disclosed. The system includes a resource management system for managing computing resources of the data center, an inventory management system for tracking physical locations of the plurality of hosts and the plurality of virtual machines in the data center and a smart rack for housing a plurality of hosts. The computing resources include a plurality of hosts and a plurality of virtual machines running on one or more of the plurality of virtual machines. The smart rack has sensors for detecting movement of each of the plurality of hosts in the data center. The smart rack also has a control unit to control the sensors and collecting data from sensors. The control unit is coupled to the inventory management system and configured to transmit the collected data to the inventory management system through a network. The plurality of hosts, the resource management system and the control unit are coupled together through the network.

29 Claims, 5 Drawing Sheets

DATA CENTER INVENTORY MANAGEMENT USING SMART RACKS

CROSS REFERENCE TO RELATED APPLICATIONS

This application is related to U.S. application Ser. No. 12/718,388 filed on Mar. 5, 2010, entitled "Managing a Datacenter Using Mobile Devices", which is being incorporated herein by reference.

BACKGROUND

Data Centers

With the explosive growth in the use of computers to host business applications, Internet Websites, etc., a need to build bigger data centers to house computers and related hardware has also grown exponentially. Many data centers (also known as "server farms") these days typically house thousands of computers and related equipments such as networking gears, etc.

A data center or a server farm is a facility to house a number of computer systems and related equipment. For example, a business organization may house all or some of their computer servers (i.e., hosts) at one physical location in order to manage these computer servers efficiently. The computer servers in a data center are typically connected to users of the computer servers via the Internet or Wide Area Network (WAN) or Local Area Network (LAN) or any other similar type of medium. These computer servers are typically used to host critical business applications. Since the business operations of these business organizations critically depend on the continuous availability of the computer servers, special attention is paid to manage data centers to prevent or minimize server down times. Inventory management of the computing resources in a data center plays a critical role in ensuring high availability of computing resources. Unfortunately, at present, data center inventory is maintained manually, typically using spreadsheets or similar manual methods. This method of tracking inventory of computing resources is highly inefficient, especially for large size data centers.

Data Center Racks

Computer systems and other related components (e.g., network switches, routers, etc.) in a data center are housed in metallic cages, typically called racks. Racks are typically designed to maximize physical space utilization in a data center room. A rack may include a number of chassis. Chassis are used to house computer systems. In some cases, a rack may house non-blade computer system directly without a use of a chassis. Chassis are typically designed to maximize physical space utilization in a rack. Computer systems and other components are typically mechanically designed to maximize space utilization in a chassis. One of these mechanical designs of computer systems is referred to as a blade. A rack typically has wire harnesses for network (and power) cables that connect each blade to the computer network. Blades are typically designed to easily slide into chassis slots. Once a blade is physically put in place in a chassis, typically, the blade automatically connects to the network and power adapters in the rack.

Radio Frequency Identification (RFID)

One of the applications of RFID technology is to track moveable objects. A typical RFID system includes a RFID tag and a RFID reader. A RFID tag is typically very small and can be produced in sizes and shapes to be easily adoptable to the objects to be tracked. A RFID tag typically includes a miniature electronic circuit and a miniature antenna. The electronic circuit generates radio frequency waves that are transmitted by the antenna. The range of such transmission is typically configurable and may vary from a few centimeters to several meters. The transmission range is configured to a particular range to fit to a particular type of object tracking application. A RFID reader is configured to receive the signals transmitted by RFID tags. One or more RFID readers are typically connected to a computer system, which is configured to read and decipher the signals transmitted by RFID tags. The signals may include some configurable information about the object to which a RFID tag is attached. The information transmitted by a RFID tag generally includes unique identification information about the RFID tag or the object being tracked.

RFID tags are typically of two types, active tags and passive tags. An active tag generally includes a built-in source of power and this type of tag may transmit signals to relatively greater distances. A passive tag, on the other hand, does not include its own built-in source of power and hence requires an external source to activate a signal transmission. Typically, a RFID reader sends signals to a passive RFID tag to activate the RFID tag.

Virtualization

The computing industry has seen many advances in recent years, and such advances have produced a multitude of products and services. Computing systems have also seen many changes, including their virtualization. Virtualization of computer resources generally connotes the abstraction of computer hardware, which essentially separates operating systems and applications from direct correlation to specific hardware. Hardware is therefore abstracted to enable multiple operating systems and applications to access parts of the hardware, defining a seamless virtual machine. The result of virtualization is that hardware is more efficiently utilized and leveraged.

The advent of virtualization has sparked a number of technologies, which allow companies to optimize the utilization of their systems. As a company's enterprise systems are usually installed at various geographic locations in different data centers, networking protocols are used to interconnect the various systems, which can then be virtualized into one or more virtual servers.

With the recent proliferation of virtual systems and servers, proper deployment and inventory management practices have become increasingly important. Even though virtual machines can be tracked using presently available tools and systems, there are no automated solutions available to track the physical locations of the physical hosts that host a particular virtual machine. Having such tracking information is important to quickly locate a malfunctioning physical server which is hosting a critical virtual machine. Manual methods of inventory control would fail to track such a physical server because virtual machines are moveable from one physical server to another and may move from one physical server to another at any time based on occurrence of some events. Some of these details are beyond the subject matter of the present disclosure, hence being omitted.

SUMMARY

In one embodiment, a system for managing physical and virtual inventory in a data center is disclosed. The system includes a resource management system for managing computing resources of the data center, an inventory management system for tracking physical locations of the plurality of hosts and the plurality of virtual machines in the data center and a smart rack for housing a plurality of hosts. The computing resources include a plurality of hosts and a plurality of virtual machines running on one or more of the plurality of the hosts. The smart rack has sensors for detecting movement of each of the plurality of hosts in the data center. The smart rack also has a control unit to control the sensors and to collect data from sensors. The control unit is coupled to the inventory management system and configured to transmit the collected data to the inventory management system through a network. The plurality of hosts, the resource management system and the control unit are coupled together through the network.

In another embodiment, a smart rack for housing computing resources in a data center is disclosed. The smart rack includes a cage for housing a plurality of chassis. Each of the plurality of chassis has a plurality of slots. Each of the plurality of slots is configured to receive a blade host and a plurality of sensors to detect insertion and removal of the blade host. The sensor network may also be used to sense and/or detect things such as temperature, vibration, moisture, etc. The smart rack also includes a control unit to control and manage the plurality of sensors. The control unit has a network interface to couple the plurality of sensors to a network. The control unit also has a power interface to couple the plurality of sensors to a power source. The control unit also includes a microcontroller to execute programming instructions to perform polling of the plurality of sensors to collect data. The collected data includes location information of a sensor related to the collected data.

In yet another embodiment, a user interface (UI) to control and depict a plurality of smart racks in a data center is disclosed. The UI includes a first graphical display to depict the plurality of smart racks in the data center. The depiction in the first graphical display mimics a physical arrangement of the plurality of smart racks in the data center. The first graphical display including visual indicators to depict error and warning conditions in the plurality of smart racks. The UI further includes a second graphical display to depict a plurality of blade hosts in a smart rack in the plurality of smart racks. The depiction in the second graphical display mimics a physical arrangement of the plurality of blade hosts. The second graphical display including visual indicators to depict error and warning conditions in the plurality of blade hosts. The UI also includes a third graphical display to display a blade information about a blade host in the plurality of blade hosts. The blade information includes system information a list of virtual machines hosted on the blade host, physical location of the blade host in the data center. The physical location includes smart rack identification, chassis identification and slot identification in which the blade host resides.

In yet another embodiment, a method of live migrating all virtual machines from a source smart rack is disclosed. The method includes receiving a list of a plurality of physical hosts and a list of virtual machines running on each of the plurality of physical hosts and receiving physical locations of each of the physical hosts. Then, physical hosts are selected in the plurality of physical hosts that are housed in the source smart rack. Further, a determination of the spare capacity of a second plurality of physical hosts that are not housed in the source smart rack is made. Finally, all virtual machines from the source smart rack are live migrated to the second plurality of physical hosts according to spare capacity on the second plurality of physical hosts.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The present invention is illustrated by way of example, and not by way of limitation, in the figures of the accompanying drawings and in which like reference numerals refer to similar elements and in which.

DETAILED DESCRIPTION

Figure 1:
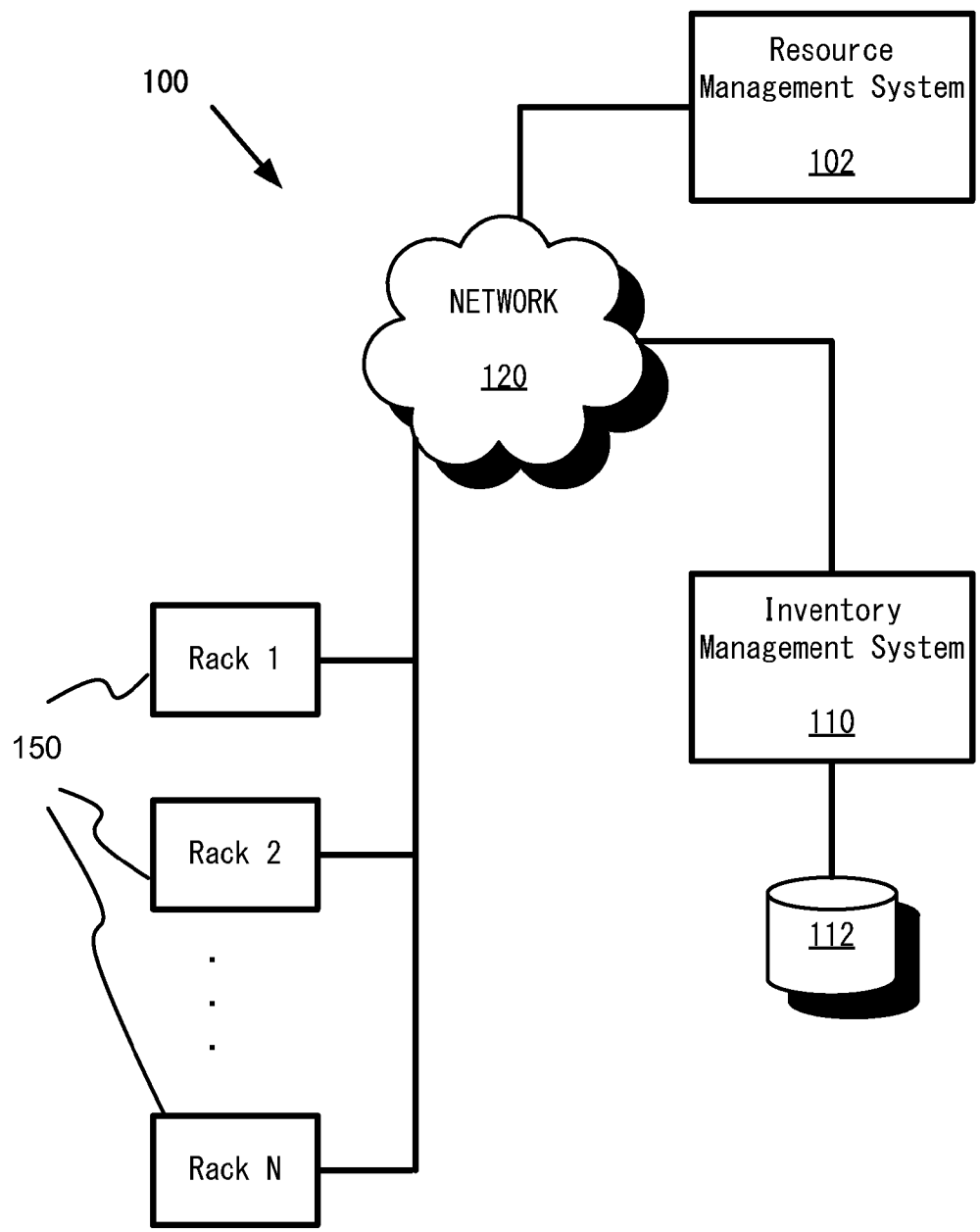
FIG. 1 illustrates a logical diagram of a data center management system in accordance with one or more embodiments of the present invention.

FIG. 1 illustrates a logical diagram of a data center management system 100. Various parts of Data Center Management System 100 may be interconnected through a Local Area Network (LAN) or a Wide Area Network (WAN) or the Internet. Hence, Network 120 may be a LAN, a WAN or the Internet. The underlying connection may be either wired or wireless (e.g., WiFi or such). It should be noted that even though some of the parts of Data Center Management System 100 are shown as a box, these parts may themselves be spread across several physical or virtual systems and may include associated parts (e.g., databases, network switches, etc.). These parts are not being shown and described to avoid obscuring the present disclosure.

Data Center Management System 100 includes a Resource Management System 102. Resource Management System 102 manages computing resources of a data center. In one example, Resource Management System 102 (e.g., VMware vSphere™) enables configuration and management of the computing infrastructure of a data center. In one or more embodiments, Resource Management System 102 may include a user interface to allow easy navigation for computing resources in a data center. Resource Management System 102 may also provide search functionality to perform lookups for virtual machines, hosts, datastores, and networks in a data center. Resource Management System 102 may also include alarms to indicate hardware failures of key components such as fans, system board and power supply. Resource Management System 102 may also provide management of data storages, including reporting storage usage, connectivity and configuration. Resource Management System 102 may also include monitoring virtual machines, resource pools and server utilization and availability.

In one or more embodiments, Resource Management System 102 may also include support for profile based configuration and management of virtualization system configurations and management. Resource Management System 102 may also be configured to provide power management functionality across the data center computer resources. Through the power management functionality, Resource Management System 102 may reduce power consumption by putting hosts in standby mode when the demand for the computing resources is lower than available online computing resources. Resource Management System 102 may also provide functionality for automatically updating or patching software on data center hosts and virtual machines.

In one or more embodiments, Resource Management System 102 may also be configured to provide physical to virtual (P2V) machine conversion functionality. For example, if a host is added to the data center that is being managed by Resource Management System 102, the host may be automatically virtualized through automatic installation of virtualization software on the host. In one or more embodiments, Resource Management System 102 maintains preconfigured virtualization software images for different types of host hardware configurations and for different types of usages. For example, one image may include a preconfigured email server, another image may include a preconfigured Web server, etc. The pre-configurations are done to adapt to the properties of the data center and the business organization that would ultimately use the newly virtualized host. For example, the pre-configured properties may include specific server names and resource addresses.

In one or more embodiments, Resource Management System 102 may provide automatic discovery of hosts such that when a host is added to the data center, the newly added host is automatically added to the list of resources being managed by Resource Management System 102. A data center may have one or more instances of Resource Management System 102, all working cooperatively to provide a highly scalable system that may be capable of managing thousands of hosts and tens of thousands of virtual machines in a data center.

Resource Management System 102, in one or more embodiments, may also provide resource management for virtual machines to allocate processor and memory resources to virtual machines running on the same physical servers and to establish minimum, maximum, and proportional resource shares for CPU, memory, disk and network bandwidth. Resource Management System 102 may also modify these allocations while virtual machines are running and may enable applications to dynamically acquire more resources to accommodate peak performance. Resource Management System 102 is also capable of effectuating moving of virtual machines from one host to another when needs arise (such as failovers, power management, etc.) or on occurrences of some pre-selected events in the data center.

Resource Management System 102, in one or more embodiments, exposes programming and communication interfaces to enable exchange of data to and from other parts of Data Center Management System 100 (e.g., Inventory Management System 110).

Data Center Management System 100 includes an inventory management system 110. Inventory Management System 100 is coupled to a data store 112 to store inventory data, including physical locations of various computing resources in a data center. Data Center Management System 100 further includes one or more smart racks 150 that are in communication with Resource Management System 102 and Inventory Management System 110 through Network 120. Inventory Management System 110 is configured to store physical locations of Racks 150 in a data center. The physical locations of Racks 150 may be stored by isle and sequence numbers or by any other addressing mode that is capable of providing identifiable physical locations of racks in a data center. For example, reference coordinates with respect to one corner of a data center room may be used for location identification of a particular rack. In another example, a matrix addressing (row x, column y) may also be used if Racks 150 are placed in a substantial rectangular arrangement in a data center room. As it is explained later in this document, a rack is mechanically configured to receive a plurality of chassis and each chassis may have provisions to provide storage for a plurality of blades. Inventory Management System 110 also stores physical locations of each chassis and each blade slot. Hence, a particular blade slot may be addressed by the combination of a rack location identifier, a chassis number and a blade space number.

Figure 2:
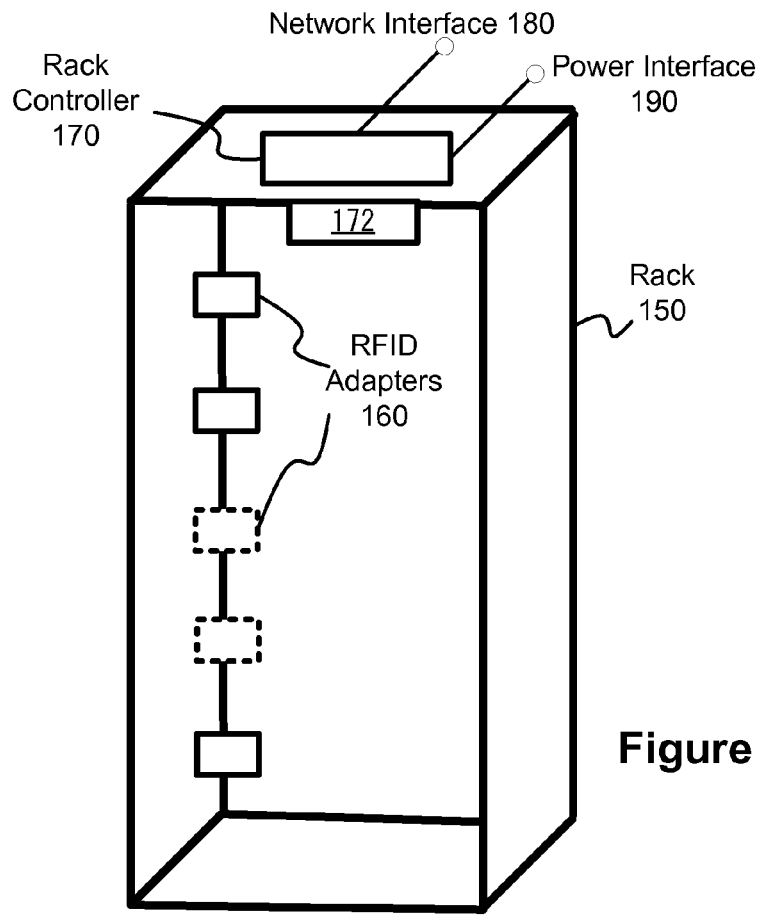
FIG. 2 illustrates a schematic diagram of a data center rack in accordance with one or more embodiments of the present invention.

FIG. 2 illustrates a rack 150 in one embodiment. Rack 150 can be substantially rectangular in shape. However, a person skilled in the art would appreciate that other mechanical shapes are within the scope of this disclosure. Rack 150 may be made of a sturdy material, such as metal, wood, alloy or polymer plastics (or any other man made materials) so long as the material is capable of providing a sturdy cage to hold heavy payload. The dimensions of Rack 150 may depend upon the configuration of the space within a data center room in which Rack 150 would be housed. The outer physical shape of a rack typically allows stacking up a plurality of racks side by side. The space inside Rack 150, in one embodiment, is designed to maximize natural air flow cooling. However, Rack 150 may also be configured with one or more fans to route heat out of Rack 150 effectively. Rack 150 may also include temperature, humidity and/or other types of sensors. These sensors may be configured to be in communication with Rack Controller 170 (to be described later) and data collected through one or more of these sensors may be stored in Inventory Management System 110 along with other data related to a particular rack. In another embodiment, this data may also be stored locally in Rack Controller 170.

Figure 3:
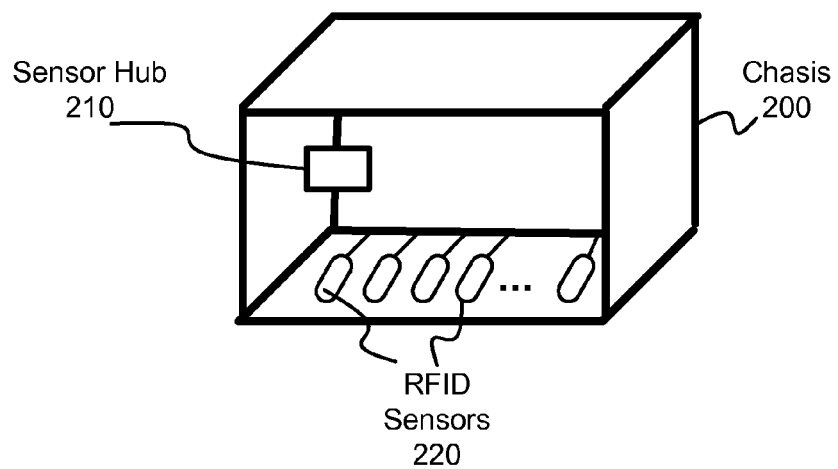
FIG. 3 illustrates a schematic diagram of a data center rack chassis in accordance with one or more embodiments of the present invention.

Rack 150 includes a plurality of RFID adapters 160 to receive sensor hubs of chassis (shown in FIG. 3). Each RFID adapter 160 includes a mechanical socket to easily receive a counterpart socket that is attached to a sensor hub in a chassis. Rack 150 may have guide rails to enable chassis to slide easily into a chassis slot. Guide rails, RFID adapter sockets and sensor hub sockets are so aligned that when a chassis slides in a chassis slot, the sensor hub of the chassis comes in mechanical and electrical contact with the corresponding RFID adapter in the rack.

In one embodiment, Rack 150 further includes a rack controller 170. Wire harnesses that connect various sensors, sensor hubs and RFID adapters terminate in Rack Controller 170. Rack Controller 170 is coupled to Inventory Management System 110 through Network Interface 180, which is an interface to couple Rack Controller with Network 120. Rack Controller 170, in one embodiment, includes a programming logic to read and collect data from various sensors and store the data, at least temporarily, prior to transmitting the collected data to Inventory Management System 110. In other embodiments, Inventory Management System 110 triggers the process of data collection. That is, at least a part of the programming logic to read and collect data from sensors resides in Inventory Management System 110. Rack Controller 170 further includes a power interface 190 to provide power to Rack Controller 170 and various adapters and sensors in Rack 150. In one embodiment, Power Interface 190 is also configured to provide electrical power to hosts in Rack 150 through a power wire harness. In another embodiment, a separate power harness is provided to power hosts and other computing resources in Rack 150. In such embodiment, Rack Controller 170 may monitor the status of the power supply for reporting purposes.

In one embodiment, Rack 150 includes a Display Unit 172 to display messages from Inventory Management System 110 and/or Resource Management System 102. Display Unit 172 may also be configured to provide a user interface to Rack Controller 170, hence enabling a designated user (i.e., a user who is authorized to manage a data center) to interact with Rack Controller 172 for the purposes of configuring, programming, testing, or debugging Rack Controller 170 and sensors. Display Unit 172 may be a liquid crystal display (LCD) or any similar type of display that is capable of displaying textual and/or graphical data and to receive inputs from a designated user. In another embodiment, Display Unit 172 may include one or more lighting devices to provide visual messages using predefined patterns or color coding for communicating predefined sets of messages. For example, a red light signal may indicate an error condition somewhere in Rack 150. A yellow light may indicate a warning, etc. In one example, these lights may be appropriately placed on the racks in a data center room so that when the designated user walks into the data center room, he/she may readily spot racks with error conditions. The designated user may use an admin console of Inventory Management System 110 to get more information about the error condition. Moreover, Display Unit 172 may also be used to get details of an error or warning conditions. Inventory Management System may be configured to send notifications via email, text messaging, etc. to a pre-configured group of people when error conditions arise in a rack. In another embodiment, a similar display unit may be provided at each chassis.

Referring now to FIG. 3, which illustrates an exemplary schematic diagram of a chassis 200. As mentioned earlier, Chassis 200 provides housing for one or more blades. As explained briefly earlier, a blade is a common term used for a special mechanical design for a computer system or any other electronic component such as a network switch. The blade design is suitable for quickly inserting or removing computing resources to or from a network and to provide optimal space utilization in a rack. The term "blade server" is well known in the art, hence a detailed description is being omitted to avoid obscuring the present disclosure. Chassis 200 includes one or more slots for sliding blades into Chassis 200. Each slot has electro-mechanical connectors to electrically and mechanically couple an inserted blade with Network 120 and the power supply. Storage Area Storage (SAN) interfaces may also be provided in each slot on Chassis. Each slot may be provided with a RFID sensor (i.e., a RFID reader) 220, which is capable of reading a RFID tag. Each inserted blade, if the inserted blade needs to be monitored by Rack Controller 170, is provided with a RFID tag. Chassis 200 also includes a sensor hub 210 to aggregate input wiring from RFID Sensors 220. Sensor Hub 210 may be a USB hub, in one embodiment. In other embodiments, Sensor Hub can be any multi conductor polarized connector. Sensor Hub 210 is configured to electrically and mechanically couple RFID sensors with the corresponding RFID Adapter 160 in Rack 150 when Chassis 200 is incorporated in Rack 150. In one embodiment, a computing resource (e.g., a computer system) may be directly incorporated in Rack 150 without Chassis 200. In such embodiment, the mechanical shape of the computing resource is similar to Chassis 200. Chassis 200 may also include temperature, humidity and/or other types of sensors. These sensors may be configured to be in communication with Rack Controller 170 and data collected through one or more of these sensors may be stored in Inventory Management System 110.

It should be noted that existing conventional racks may be retrofitted with above mentioned electro-mechanical hardware (e.g., various sensors, hubs, adapters, rack controller, etc.) to convert existing conventional racks into Rack 150.

In one embodiment, security features may also be incorporated in Rack 150 and/or Chassis 200. For example, a security pad may be installed on each Rack 150. The security pad may be coupled to an electronic security system and may be used to identify and authenticate a person, who attempts to remove Chassis 200 or a blade from Chassis 200. The security pad may have a number pad, a fingerprint scanner or a security card scanner. Mechanical locks may be provided on removable parts of Rack 150 or Chassis 200. These mechanical locks may be released only if a person attempting to remove or insert a component properly authenticate himself/herself. In one embodiment, Display Unit 172 may also be used as a security pad for entering authentication information.

It should be noted that the mechanical placement of various sensors, hubs, adapters, rack controller, etc. may change depending upon design considerations. As such, these components may be placed at any suitable locations in Rack 150 so long as the functionality remains within the scope of the present disclosure.

It should also be noted that in some embodiments, other technologies (e.g., Bluetooth, Bar codes, Open Computer Vision, Pattern Recognition, etc.) may also be used instead of RFID by using different types of sensors and devices that are suitable for a particular type of technology. For example, if the bar code technology is used, a blade will be affixed with a unique bar code while RFID sensors are replaced by bar code readers. In one embodiment, MAC addresses of computing resources may also be used instead of RFID. In such embodiment, a MAC address to Physical location mapping may be stored in Inventory Management System 110.

Figure 4:
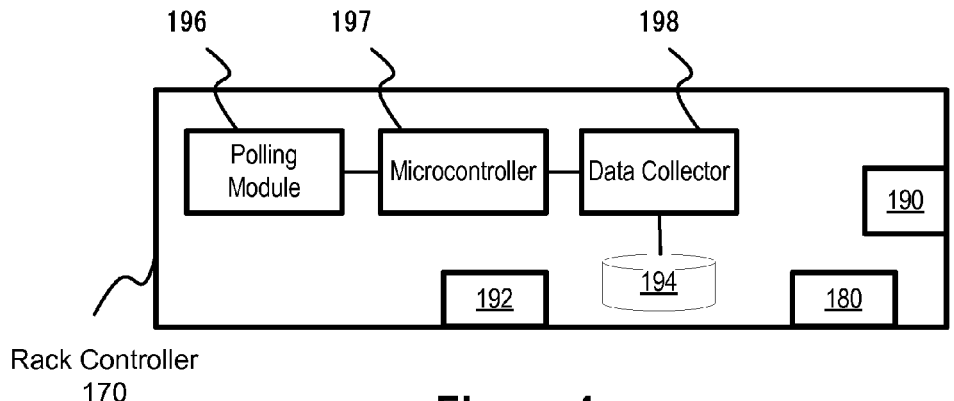
FIG. 4 illustrates a logical diagram of a rack controller in accordance with one or more embodiments of the present invention.

FIG. 4 illustrates a logical block diagram of Rack Controller 170. In one embodiment, Rack Controller 170 includes a microcontroller 197 to execute programming instructions for controlling Rack 150 sensors, for collecting data from sensors, and for storing the collected data in a local database 194. Microcontroller 197 may also be used for enabling communication between components of Rack 150 with Inventory Management System 110 and for providing display logic for Display Unit 172. Rack Controller 170 further includes a communication port 192 to enable communication between the sensors of Rack 150 and programming modules such as Polling Module 196 and Data Collector 198. Microcontroller 197 may also be coupled to Network Interface 180 and Power Interface 190. Microcontroller 197 may also provide an interface to configure Rack Controller 170 through additional programming instructions. Database 194 may be a solid state memory device or it can also be a magnetic disk memory. Database 194 may also be used for storing programming instructions to or from various modules of Rack Controller 170. Display Unit 172 may be used for adding new programming instructions or configurations to Rack Controller 170. Alternatively, new programming instructions and/or configurations may be pushed to Rack Controller 170 from or through Inventory Management System 110.

Figure 5:
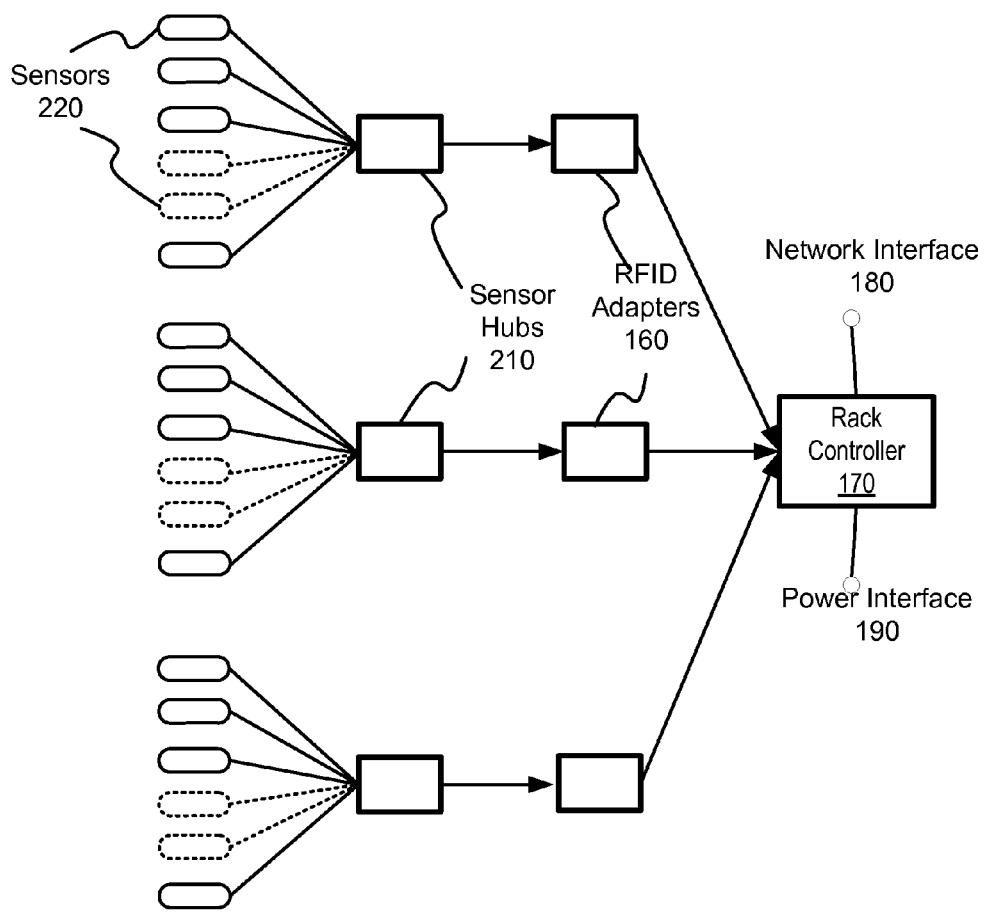
FIG. 5 illustrates a logical diagram of sensors and readers interconnections with a rack controller in accordance with one or more embodiments the present invention.

FIG. 5 illustrates a schematic diagram of exemplary interconnections of RFID Sensors 220, Sensor Hubs 210, RFID Adapters 160 and Rack Controller 170. In one embodiment, the interconnections are through a wire harness. In other embodiments, the interconnections may be implemented through wireless communication technologies such as Bluetooth or WiFi. In another embodiment, the interconnections may be provided through the LAN wiring that can couple RFID Sensors 220, Sensor Hubs 210 and RFID Adapters 160 to Network 120. In one embodiment, network communication to and from computing resources in Rack 150 continues to work unaffected when one or more RFID Sensors 220, Sensor Hubs 210, RFID Adapters 160, or Rack Controller 170 malfunction. To avoid introducing an extra point of failure, the system and process of collecting and managing inventory data work separate from normal computing operations of computing resources in Rack 150. Moreover, Rack Controller 170 may be equipped with programming logic to perform routine testing of RFID Sensors 220, Sensor Hubs 210 and RFID Adapters 160. The programming logic in Rack Controller 170 is also configured to collect inventory data and store at least a part of collected data locally for a period of time before the collected data is transmitted to Inventory Management System 110. The locally stored data may be transmitted to Inventory Management System 110 at preconfigured regular intervals. Alternatively, the locally stored data may be pushed to Inventory Management System 110 when Inventory Management System 110 requests such information. In another embodiment, Inventory Management System 110 may retrieve the locally stored data directly from Rack Controller 170 database. Some information, for example when a blade is removed, may be transmitted to Inventory Management System 110 immediately or as early as possible. In one or more embodiments, Polling Module 196 performs polling of sensors in Rack 150 at regular intervals. In another embodiment, any other technique for reading RFID tags may be used so long as the technique is capable of detecting events such as removal of blades, insertion of blades, etc.

Referring back to Inventory Management System 110 of FIG. 1. In one embodiment, a user interface may be provided to enable initial data entry with respect to unique identifications (IDs) of smart racks, chassis and sensors along with physical locations of these components in a data center. When a blade with an RFID tag is inserted in any slot in any smart rack, RFID sensor of that slot sends a signal to Rack Controller 170 (or in another embodiment, Rack Controller 170 may receive this information through the polling process). The inventory data in Inventory Management System 110 is automatically updated to reflect the addition of this new blade including a host name and a unique ID number. Resource Management System 102 is also automatically updated when a new blade is detected in a smart rack. In one embodiment, Resource Management System 102 may automatically install virtualization software on the newly added host and may also perform further configurations such as setting up one or more virtual machines on the newly added host and adding these virtual machines in a particular cluster or some other type of logical group of virtual machines.

Figure 6:
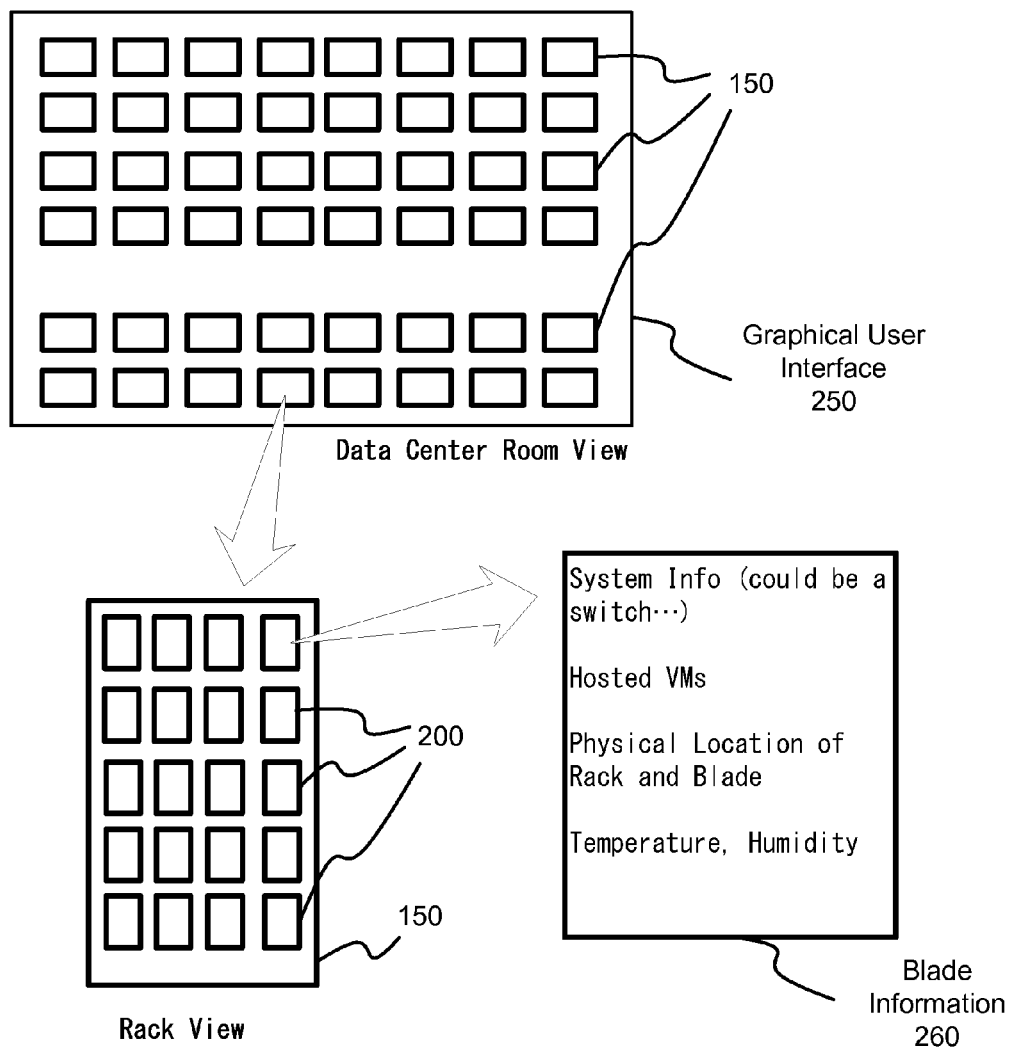
FIG. 6 illustrates an exemplary graphical user interface showing racks in a data center in accordance with one or more embodiments of the present invention.

FIG. 6 illustrates an exemplary graphical user interface (GUI) 250 for viewing data center racks on a display. In one embodiment, GUI 250 shows a graphical view of a data center room in which a plurality of racks are housed. GUI 250 substantially mimics the physical arrangement of the racks in a data center room. In one embodiment, GUI 250 display may be re-arranged to match the actual arrangement of racks in a data center room. The rearrangement may be accomplished by moving displayed graphical objects on the display in a desired arrangement and saving the new arrangement. In one exemplary embodiment, Inventory Management System 110 can be configured to retrieve locations of the plurality of racks in the data center room through rack location sensors in a data center room and may automatically generate a graphical depiction of racks. In one example, the WiFi triangulation method may also be used to determine locations of racks in a data center room.

The displayed object on GUI 250 may also be configured to display error conditions. In one exemplary embodiment, a color coding method may be used to visually display various operational and/or environmental conditions for each rack. In one exemplary embodiment, when a mouse pointer is brought over (or clicked, double clicked, etc.) a particular rack object in GUI 250, GUI 250 displays a graphical view of the internal details of the rack (as shown as "Rack View" in FIG. 6). The graphical objects in Rack View depict a plurality of Chassis and a plurality of blades. A color coded status may also be incorporated in each of the displayed objects to indicate operational conditions. In one exemplary embodiment, when a graphical depiction of a chassis or a blade is selected, more information about the depicted object is displayed (e.g., Blade Information 260). In one embodiment, Blade Information 260 may include system information, hosted virtual machines, physical location, temperature, humidity, etc. Some of the information, for example hosted virtual machines, system information, etc. is retrieved from Resource Management System 102. Other information may be retrieved either from the corresponding Rack Controller 150 or from Inventory Management System 110 depending upon a particular configuration.

GUI 250 may also be used to configure sending out notifications to a preconfigured group of entities. For example, the system may be configured to send emails, text messages, voice calls/voice mails, etc. to a preconfigured group of people in the event of the occurrence of one or more types of error conditions.

Still further, in one exemplary embodiment, Resource Management System 102 may retrieve blade location information from Inventory Management System 110 and use the retrieved information to move critical virtual machines to relatively safe locations in the data center. For example, if flood conditions are detected, some or all virtual machines on hosts that reside in the lower parts of racks may be moved to the upper parts of racks. Furthermore, since top parts of racks would generally be hotter than the lower parts, some critical virtual machines may be moved to relatively lower parts of racks. It may be noted that Resource Management System 102 is capable of moving virtual machines from one host to another using the live migration technology (e.g., VMware VMotion™).

In one exemplary embodiment, GUI 250 may be configured to divide racks in a data center in different sections. For example, a particular section of racks may be reserved for hosting computing resources of a particular organization (in the scenarios where the same data center is being used for hosting computing resources of different business organizations). In one embodiment, if the rack reservation is based on business organization, a network fencing scheme may be adopted to provide network isolation among computing resources of distinct business organizations. In another embodiment, the partition may be done based on types of computing resources. For example, a particular rack may be reserved to host Web servers and another rack may be marked to host email servers. In one exemplary embodiment, when a new blade is inserted into the rack which is reserved for Web servers, Resource Management System 102 automatically provisions the newly added blade to be used as a Web server.

In one embodiment, when a new blade is added, Resource Management System 102 queries Inventory Management System 110 for location information as well as any particular type of rack reservation. In one embodiment, rack reservation may be put in place on a live data center. In this embodiment, Inventory Management System 110 will notify Resource Management System 102 about changes in rack reservation and Resource Management System 102 will live-migrate virtual machines according to the rack reservation scheme.

In one example, Resource Management System 102 may provide automatic power saving features by consolidating virtual machines on fewer hosts when computing demand is low and then shutting down the remaining hosts. In one embodiment, Data Center Management System 100 further enhances the power save feature by consolidating virtual machines on fewer smart racks when the computing demand is low and then shutting down the remaining smart racks. Further, from time to time, smart racks may be put out of use for maintenance purposes. However, in order to do so, the hosts need be shutdown, hence causing interruptions in computing resources availability. Data Center Management System 100, in one embodiment, is configured to automatically live migrate computing resources from a particularly identified smart rack. Further, Data Center Management System 100 may also be configured to monitor computer resource utilization for computing resources on each smart rack and if it is determined that a particular smart rack is only being used to run a number of virtual machines and if the number is below a set threshold, Data Center Management System 100 may start a process of live migrating the virtual machine from the particular smart rack to other racks. Once the virtual machines are live migrated, the particular smart rack may be put in a standby mode to save power.

Figure 7:
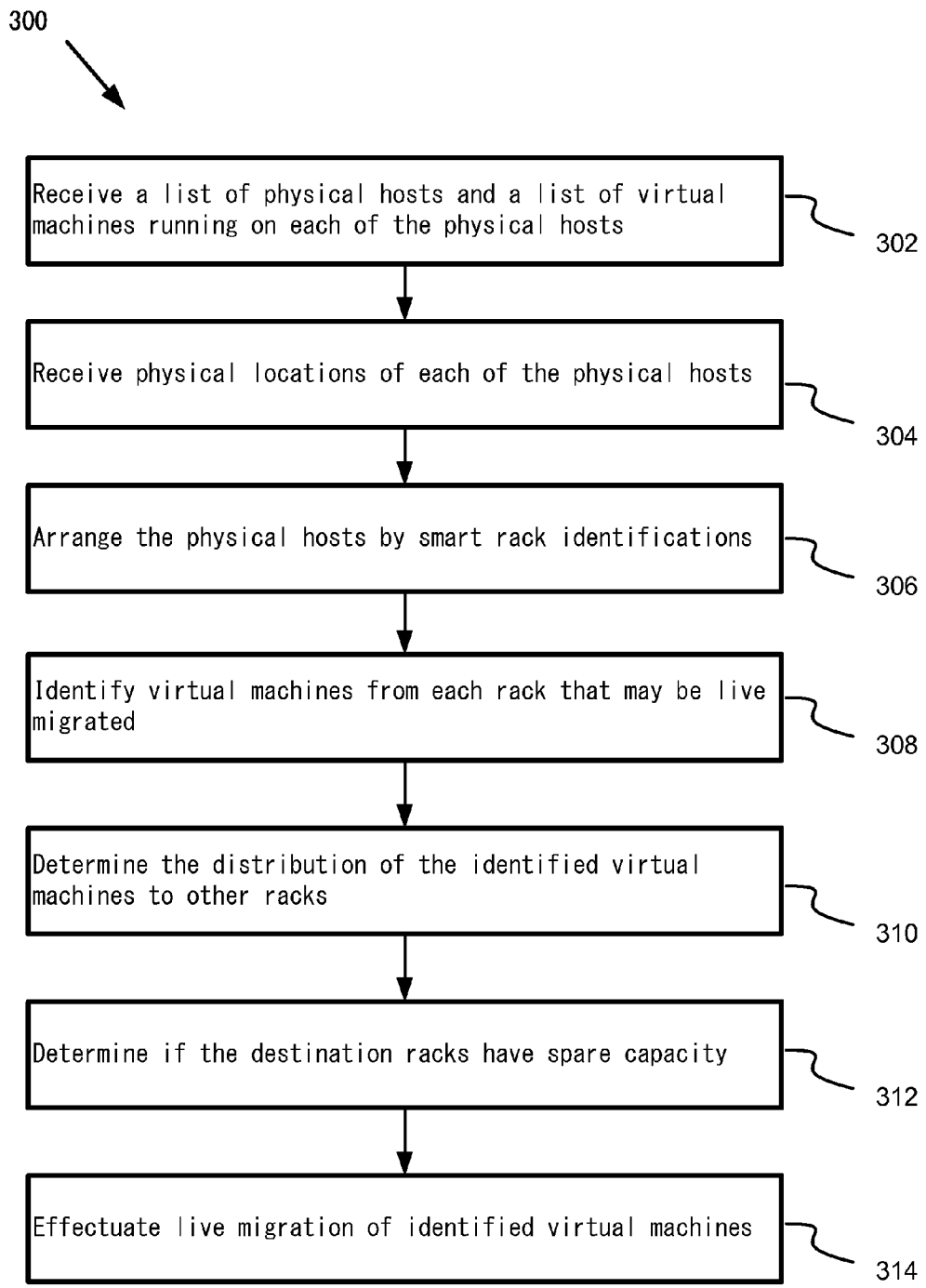
FIG. 7 illustrates a flow diagram for preparing a rack for maintenance or power shutdown in accordance with one or more embodiments of the present invention.

Accordingly, FIG. 7 illustrates a process 300 of implementing live migration of virtual machines from a source smart rack to one or more destination smart racks. At step 302, a list of physical hosts and a list of virtual machines running each of the physical hosts are received from Resource Management System 102. At step 304, Inventory Management System 102 provides the physical locations (i.e., smart racks for each of the physical hosts). At step 306, the list of physical hosts is arranged by smart rack IDs to make a list of physical hosts on each of the smart racks in a data center. Since a list of virtual machine for each of the physical hosts is available, a list of virtual machines on each of the smart racks is created. At step 308, virtual machines that can be live migrated are identified. In one example, if a smart rack needs to be shutdown, all virtual machines from this smart rack need to be live migrated. At step 310, one or more destination smart racks are identified for receiving the identified virtual machines that are to be moved. At step 312, such determination may be made based on spare computing power on one or more destination racks. For example, if a particular destination rack has hosts with a total computing capacity to run 100 virtual machines of a certain type and at present there are only 20 active virtual machines, then this destination smart rack could be candidate for receiving more virtual machines from the source smart rack. In one embodiment, a max capacity utilization factor of a destination physical host is also considered. In another embodiment, a prior capacity reservation factor of the destination physical host is taken into the consideration. At step 314, live migration of all virtual machines from a source smart rack is commenced.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. In one embodiment, the apparatus can be specially constructed for the required purpose (e.g. a special purpose machine), or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. The machines can also be virtualized to provide physical access to storage and processing power to one or more users, servers, or clients. Thus, the virtualized system should be considered a machine that can operate as one or more general purpose machines or be configured as a special purpose machine. Each machine, or virtual representation of a machine, can transform data from one state or thing to another, and can also process data, save data to storage, display the result, or communicate the result to another machine.

The programming instructions and modules can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible/non-transitory medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A system for managing computing resources inventory in a data center, the system comprising:
   a resource management system for managing the computing resources of the data center, the computing resources includes a plurality of hosts and a plurality of virtual machines running on one or more of the plurality of hosts;

a smart rack for housing one or more hosts in the plurality of hosts, the smart rack having sensors for detecting physical movement of the one or more hosts, the smart rack having a control unit to control the sensors and to collect data from the sensors; and an inventory management system for tracking and storing physical locations of the plurality of hosts and the smart rack, the control unit is coupled to the inventory management system and configured to transmit the collected data to the inventory management system through a network, wherein, the plurality of hosts, the resource management system, the inventory management system and the control unit are coupled together through the network.

2. The system of claim 1 wherein the resource management system is configured to live migrate a virtual machine in the plurality of virtual machines from a first host in the plurality of hosts to a second host in the plurality of hosts based on physical location characteristics of the first host and the second host.

3. The system of claim 1 wherein the resource management system is configured to provide network isolation for a part of the plurality of virtual machines.

4. The system of claim 1 wherein the smart rack further includes a plurality of chassis to house more than one of the hosts, each of the plurality of chassis including a sensor for detecting an insertion or removal of individual hosts, each of the plurality of chassis including a sensor hub.

5. The system of claim 1 wherein the smart rack further includes a wire harness to couple the sensor with the control unit through the sensor hub in each of the plurality of chassis and a sensor adapter in the smart rack.

6. The system of claim 1 wherein the inventory management system includes an administration panel to enable entering location information of the smart rack in the data center.

7. The system of claim 1 wherein the inventory management system is configured to retrieve location information of the smart rack through a rack location sensor in the data center.

8. The system of claim 1 wherein the smart rack further includes a display unit to display system messages from the inventory management system.

9. The system of claim 1 wherein the smart rack further includes a light indicator to indicate error conditions in the smart rack, the error conditions are determined by one of the inventory management system or the resource management system or the control unit.

10. The system of claim 1 wherein the control unit includes a microcontroller to execute programming instructions to perform operations on the sensors.

11. The system of claim 1 wherein the control unit includes a network interface to couple the sensors with the network.

12. The system of claim 1 wherein the control unit includes a power interface to couple the sensors with a power supply.

13. The system of claim 1 wherein the control unit includes a database to provide local storage of the collected data.

14. The system of claim 1 wherein the control unit includes a polling module to activate the sensors at pre-configured intervals.

15. The system of claim 8 wherein the control unit is configured to be operated by a designated user through the display unit.

16. The system of claim 15 wherein the control unit is configured to receive new control instructions through one of the display unit or the inventory management system.

17. The system of claim 1 wherein the sensors are at least one of Radio Frequency Identification (RFID) sensors, Bluetooth sensors, and bar code sensors.

18. A smart rack for housing computing resources in a data center, the smart rack comprising:
a cage for housing a plurality of chassis, each of the plurality of chassis having a plurality of slots, each of the plurality of slots is configured to receive a blade host;
a plurality of sensors to detect insertion and removal of the blade host; and
a control unit to control and manage the plurality of sensors, the control unit having a network interface to couple the plurality of sensors to a network, the control unit also having a power interface to couple the plurality of sensors to a power source, the control unit having a microcontroller to execute programming instructions to perform polling of the plurality of sensors to collect data, the collected data includes location information of a sensor related to the collected data.

19. The smart rack of claim 18 wherein the control unit further includes a database to store data collected from the plurality of sensors.

20. The smart rack of claim 18 wherein the control unit includes a polling module to perform data collection operations on the plurality of sensors at pre-configured intervals.

21. The smart rack of claim 20 wherein the control unit further includes an interface to couple the plurality of sensors with the polling module.

22. The smart rack of claim 18 wherein the plurality of sensors are at least one of Radio Frequency Identification (RFID) sensors, Bluetooth sensors, and bar code sensors.

23. The smart rack of claim 18 further including a temperature sensor and a humidity sensor.

24. The smart rack of claim 18 further including a security pad and locks to prevent unauthorized removal of the blade host.

25. The smart rack of claim 18 further including a display unit to display system messages from the control unit.

26. The smart rack of claim 18 further including a light indicator to indicate error conditions in the smart rack, the error conditions are determined by the control unit.

27. A method of live migrating all virtual machines from a source smart rack, the method comprising:
receiving a list of a plurality of physical hosts and a list of virtual machines running on each of the physical hosts;
receiving physical locations of each of the physical hosts;
selecting physical hosts in the plurality of physical hosts that are housed in the source smart rack;
determining spare capacity of a second plurality of physical hosts that are not housed in the source smart rack; and
live migrating all virtual machines running on the source smart rack to the second plurality of physical hosts according to spare capacity on the second plurality of physical hosts.

28. The method of claim 27 wherein the determining of spare capacity takes into consideration a maximum utilization factor for each of the second plurality of physical hosts.

29. The method of claim 27 wherein the determining of spare capacity takes into consideration a prior capacity reservation for each of the second plurality of physical hosts.

* * * * *